(12) United States Patent
Donelly et al.

(10) Patent No.: US 6,766,500 B1
(45) Date of Patent: Jul. 20, 2004

(54) MULTIPLE PASS OPTIMIZATION FOR AUTOMATIC ELECTRONIC CIRCUIT PLACEMENT

(75) Inventors: Ross A. Donelly, Sunnyvale, CA (US); William C. Naylor, San Jose, CA (US); Michael Fu, San Jose, CA (US)

(73) Assignee: Synopsys, Inc., Mountain View, CA (US)

( * ) Notice: Subject to any disclaimer, the term of this patent is extended or adjusted under 35 U.S.C. 154(b) by 87 days.

(21) Appl. No.: 10/016,232

(22) Filed: Dec. 6, 2001

(51) Int. Cl.$^7$ .............................................. G06F 17/50
(52) U.S. Cl. .............................. 716/10; 716/13; 716/14; 716/12; 716/1
(58) Field of Search ........................ 716/10, 1–9, 11–15

(56) References Cited

U.S. PATENT DOCUMENTS

| | | | | |
|---|---|---|---|---|
| 5,218,551 A | * | 6/1993 | Agrawal et al. | 716/10 |
| 6,230,304 B1 | * | 5/2001 | Groeneveld et al. | 716/7 |
| 6,360,356 B1 | * | 3/2002 | Eng | 716/18 |
| 6,405,345 B1 | * | 6/2002 | Ginetti | 716/2 |
| 6,415,426 B1 | * | 7/2002 | Chang et al. | 716/9 |
| 6,480,991 B1 | * | 11/2002 | Cho et al. | 716/8 |
| 6,507,938 B1 | * | 1/2003 | Roy-Neogi et al. | 716/10 |
| 6,532,577 B1 | * | 3/2003 | Mbouombouo et al. | 716/6 |
| 6,532,582 B1 | * | 3/2003 | Zolotykh et al. | 716/11 |
| 6,543,032 B1 | * | 4/2003 | Zoltykh et al. | 716/2 |
| 6,546,539 B1 | * | 4/2003 | Lu et al. | 716/12 |
| 6,546,541 B1 | * | 4/2003 | Petranovic et al. | 716/18 |
| 6,557,144 B1 | * | 4/2003 | Lu et al. | 716/2 |
| 6,564,361 B1 | * | 5/2003 | Zolotykh et al. | 716/8 |
| 2001/0010090 A1 | * | 7/2001 | Boyle et al. | 716/2 |
| 2001/0013114 A1 | * | 8/2001 | LaBerge | 716/10 |
| 2002/0069396 A1 | * | 6/2002 | Bhattacharya et al. | 716/7 |
| 2002/0104066 A1 | * | 8/2002 | Irie | 716/11 |
| 2002/0116685 A1 | * | 8/2002 | van Ginneken | 716/1 |
| 2002/0162085 A1 | * | 10/2002 | Zolotykh et al. | 716/18 |
| 2002/0188919 A1 | * | 12/2002 | Raibaut et al. | 716/9 |
| 2003/0005398 A1 | * | 1/2003 | Cho et al. | 716/8 |

* cited by examiner

*Primary Examiner*—Matthew Smith
*Assistant Examiner*—Magid Y. Dimyan
(74) *Attorney, Agent, or Firm*—Bever, Hoffman & Harms, LLP; Jeanette S. Harms

(57) ABSTRACT

A computer implemented process for the automatic creation of integrated circuit (IC) geometry including a multiple pass process flow using multiple passes of direct timing driven placement after a first pass of non-direct timing driven placement. First, a high level description of the circuit design may be synthesized. Next, a non-direct timing driven placement process may place the design. Then the placed design may be routed. Alternatively, routability may be estimated. After routing, a modified design may be resynthesized. The resynthesized design may then be placed according to a direct timing driven placement process. This sequence may be repeated several times.

7 Claims, 3 Drawing Sheets

MULTIPLE PASS OPTIMIZATION FOR AUTOMATIC ELECTRONIC CIRCUIT PLACEMENT

FIELD OF THE INVENTION

Embodiments of the present invention relate to the field of electronic design automation (EDA). More particularly, embodiments of the present invention relate to techniques for cell placement and other optimizations used in the design and fabrication of integrated circuit devices.

BACKGROUND ART

An electronic design automation (EDA) system is a computer software system used for designing integrated circuit (IC) devices. The EDA system typically receives one or more high level behavioral descriptions of an IC device (e.g., in HDL languages like VHDL, Verilog, etc.), as represented by HDL 12 of FIG. 1, and translates this high level design language description into netlists of various levels of abstraction. At a higher level of abstraction, a generic netlist is typically produced based on technology independent primitives. The generic netlist can be translated into a lower level technology-specific netlist based on a technology-specific library that has gate-specific models for timing and power estimation. A netlist describes the IC design and is composed of nodes (elements) and edges, e.g., connections between nodes, and can be represented using a directed cyclic graph structure having nodes which are connected to each other with signal lines. A single node can have multiple fan-ins and multiple fan-outs.

The netlist is typically stored in computer readable media within the EDA system and processed and verified using many well known techniques. One result is a physical device layout in mask form which can be used to directly implement structures in silicon to realize the physical IC device, step 28 of FIG. 1.

The rapid growth of the complexity of modern electronic circuits has forced electronic circuit designers to rely upon computer programs to assist or automate most steps of the design process. Typical circuits today contain hundreds of thousands or millions of individual pieces or "cells." Such a design is much too large for a circuit designer or even an engineering team of designers to manage effectively manually.

FIG. 1 shows a typical system 10 of computer programs and other processes used to automate the design of electronic circuits. Within system 10, the designer first produces a high-level description 12 of the circuit in a hardware description language such as Verilog or VHDL. Then this high-level description 12 is converted into a netlist 16a using a computer implemented synthesis process 14 such as the "Design Compiler" by Synopsys of Mountain View, Calif. A netlist 16a is a description of the electronic circuit which specifies what cells compose the circuit and which pins of which cells are to be connected together using wires ("nets"). Importantly, the netlist 16a does not specify where on a circuit board or silicon chip the cells are placed or where the wires run which connect them together. Determining this geometric information is the function of an automatic placement process 18 and an automatic routing process 22, both of which are shown in FIG. 1 and are typically computer programs.

Next, the designer supplies the netlist 16a into the computer implemented automatic cell placement process 18 of FIG. 1. The automatic placement computer program 18 finds a location for each cell on a circuit board or silicon chip. The locations are specified, typically, in two-dimensional spatial coordinates, e.g., (x, y) coordinates, on the circuit board or silicon chip. The locations are typically selected to optimize certain objectives such as wire length, wire routibility, circuit speed, circuit power consumption, and/or other criteria, subject to the condition that the cells are spread evenly over the circuit board or silicon chip and that the cells do not overlap with each other. The output of the automatic cell placement process 18 includes a data structure 20 including the (x, y) position for each cell of the IC design. In some cases, the netlist 16a is modified and a new netlist 16b is generated. In other cases, the netlist 16b is the same as netlist 16a.

Next, the designer supplies the netlist 16a and the cell location data structure 20, generated by the placement program 18, to a computer implemented automatic wire routing process 22.

Unfortunately, when dealing with hundreds of thousands or millions of cells, each cell typically having several interconnecting wires, even the best placements frequently can not be wired (step 22 of FIG. 1) due to congestion. Quite simply, there may be more wires which need to routed through particular areas of an integrated circuit than can be accommodated by the available places to route such wires.

If the design can not be wired by process 22, one well known technique which may be employed is optional process enlarge cell area allocation for congestion relief 23. In this process, the area allocated to cells in the region(s) of congestion is increased. The size of the cells is not increased, just the area allocated to the cells. This leaves room for routing wires within the apparent cell, which has the effect of creating more room for routing wires once the cells are placed, thus relieving congestion.

If the cell area allocations are optionally enlarged, the new cell area allocations are incorporated into the netlist database 16A and the layout process is repeated, beginning with computer implemented automatic cell placement process 18.

It would be desirable to resynthesize the design, that is, to continue the process flow through automatic post-layout synthesis optimizations 26 (or repeating computer implemented synthesis process 14) and then repeating cell placement process 18 with the "enlarged" cells. In theory, a new synthesis should help to further optimize the design. Unfortunately, however, in the prior art practice, multiple passes of automatic post-layout synthesis optmizations 26 (or computer implemented synthesis process 14) and placement 18 generally degrade the placement, leading to greater timing problems. It is believed that this behavior results from non-convergence of the two processes—synthesis 14 tries to optimize timing (in a non-placed form) while placement 18 tries to optimize wire length. These two goals may be in conflict.

If computer program 22 completes routing all wires, it may generate wire geometry within data structure 24. The wire geometry data structure 24 and cell placement data structure 20 together represent the details of the final circuit implementation.

As a check of the circuit implementation, the timing of the implementation is typically analyzed in optional automatic post-layout synthesis optimizations 26 and compared to the requirements of the design. For example, the designer may determine if the required minimum clock speed has been achieved. There are a variety of well known techniques and EDA tools to accomplish this task.

It is not uncommon for the results of analysis 26 to indicate some failures to meet required circuit timings, especially the first time through. If there are failures, an automatic synthesis pass makes modifications directly to the netlist.

Such adjustments are usually minor, such as changing the current-handling capacity of a circuit element in order to make its output signal travel faster to another circuit. Another common adjustment is to add a buffer cell, which may be used to speed signal propagation through the integrated circuit.

The modified circuit design 12 is then taken through an incremental (detailed) placement process 27 to legalize the added cells (i.e., to find spaces for the new cells). If automatic post-layout synthesis optimizations 26 indicates that all timings meet requirements, the circuit implementation is ready for fabrication 28. Of course, the analysis may indicate the need for further changes, additional passes through automatic post-layout synthesis optimizations 26 and incremental placement and legalization 27.

Still referring to FIG. 1, a well known, commonly used algorithm for placement process 18 is known as a quadratic-partition algorithm.

This prior art process is based on the observation that the problem of placing cells to minimize sum-of-squared wire lengths can be solved quickly and exactly for large problems using standard techniques. Partitioning is used to guarantee that the cells are spread evenly across the silicon chip or circuit board.

In the quadratic portioning process all cells start out in a rectangle which is the entire silicon chip or circuit board. This rectangle is partitioned into 2 rectangles. Each of these 2 rectangles gets partitioned into 2 rectangles, etc., until each rectangle contains a small number of cells (e.g., 20 cells). Usually, the process alternates between vertical and horizontal partition lines for each iteration of the main loop.

Quadratic partitioning placement runs relatively quickly on large circuits but its formulation is very inflexible. It can only optimize weighted sum-of-squared wire length. However, this metric is really the wrong objective. Namely, what is important in cell placement is wire routibility, circuit timing, power consumption, etc. Quadratic wire length is a poor approximation for these metrics. It is possible to approximate these metrics somewhat better by changing wire weights to emphasize wires that seem to be more important to make short. For example, wires on the critical timing path can have higher weight in order to improve the timing of the critical path. However, this second approach is still a poor approximation to the true objective function that placement should optimize. Also, the selection of the position of the partition line location is arbitrary and unfortunately can introduce non-optimal artifacts in the placement along the partition lines.

A more effective placement process is described in U.S. patent application Ser. No. 09/216,632 filed on Dec. 16, 1998, "Non-linear Optimization System and Method for Wire Length and Delay Optimization for an Automatic Electronic Circuit Placer," hereinafter referred to as the technique of direct timing driven placement.

Direct timing driven placement uses general unconstrained non-linear optimization techniques to find a coarse placement of cells on a circuit board or silicon chip. A master objective function (MOF) is defined which evaluates the quality of a particular cell placement. In effect, the MOF measures the "goodness" of the particular cell placement. A non-linear optimization process finds an assignment of values to the function variables which minimizes the MOF. The MOF is chosen so that values of variables which minimize the MOF correspond to a good coarse placement.

In particular, the MOF is a weighted sum of functions which evaluate various metrics. An important metric taken into consideration within the MOF is the density function which measures how well spread out the cells are in the placement.

Other component functions of the MOF are a wire-length function which measures total linear wire-length, a delay function which measures circuit timing, and a power function which measures circuit power consumption. The barrier metric or "boundary function," penalizes placements with cells outside the allowed placement region.

Unfortunately, when computer implemented automatic cell placement process 18 is implemented using direct timing driven placement, the placement results are generally unsatisfactory.

This rather surprising result stems from the simultaneous optimization of timing while placing cells within the direct timing driven placement process. Direct timing driven placement attempts to optimize timing at the instantaneous moment of placement. Unfortunately, direct timing driven placement does not know what the timing will be after automatic post-layout synthesis and legalization 27. This lack of future knowledge may drive direct timing driven placement to make improper optimizations.

As an unfortunate consequence, the many potential benefits of direct timing driven placement have not been realized in the prior art. Thus, integrated circuits are larger, more costly, run slower and require more time and engineering effort to design.

Therefore, it would be advantageous to provide a method and system that enables the optimizations of direct timing driven placement of electronic circuits. A further need exists to resynthesize a circuit description after cell areas have been enlarged for congestion relief. A still further need exists for multiple pass optimization of the physical design of an integrated circuit.

SUMMARY OF THE INVENTION

Embodiments of the present invention enable the use of direct timing driven placement of electronic circuits. Further embodiments of the present invention allow a circuit design to be resynthesized after the design has been placed. Still further embodiments of the present invention enable optimization of the physical design of an integrated circuit through multiple passes of the physical design process.

A computer implemented process for the automatic creation of integrated circuit (IC) geometry is disclosed. In particular, the present invention includes a multiple pass process flow which uses multiple passes of direct timing driven placement after a first pass of non-direct timing driven placement. First, a high level description of the circuit design may be synthesized. Next, a non-direct timing driven placement process may place the design. Then the placed design may be routed. After routing, a modified design may be resynthesized. The resynthesized design may then be placed according to a direct timing driven placement process. This sequence may be repeated several times.

Another embodiment of the present invention allows for congestion driven routing through multiple loops of synthesis, direct timing driven placement and routing.

In one embodiment of the present invention, direct timing driven placement is made more useful by initializing the placer with non-direct timing driven placement.

DETAILED DESCRIPTION OF THE INVENTION

Figure 1:
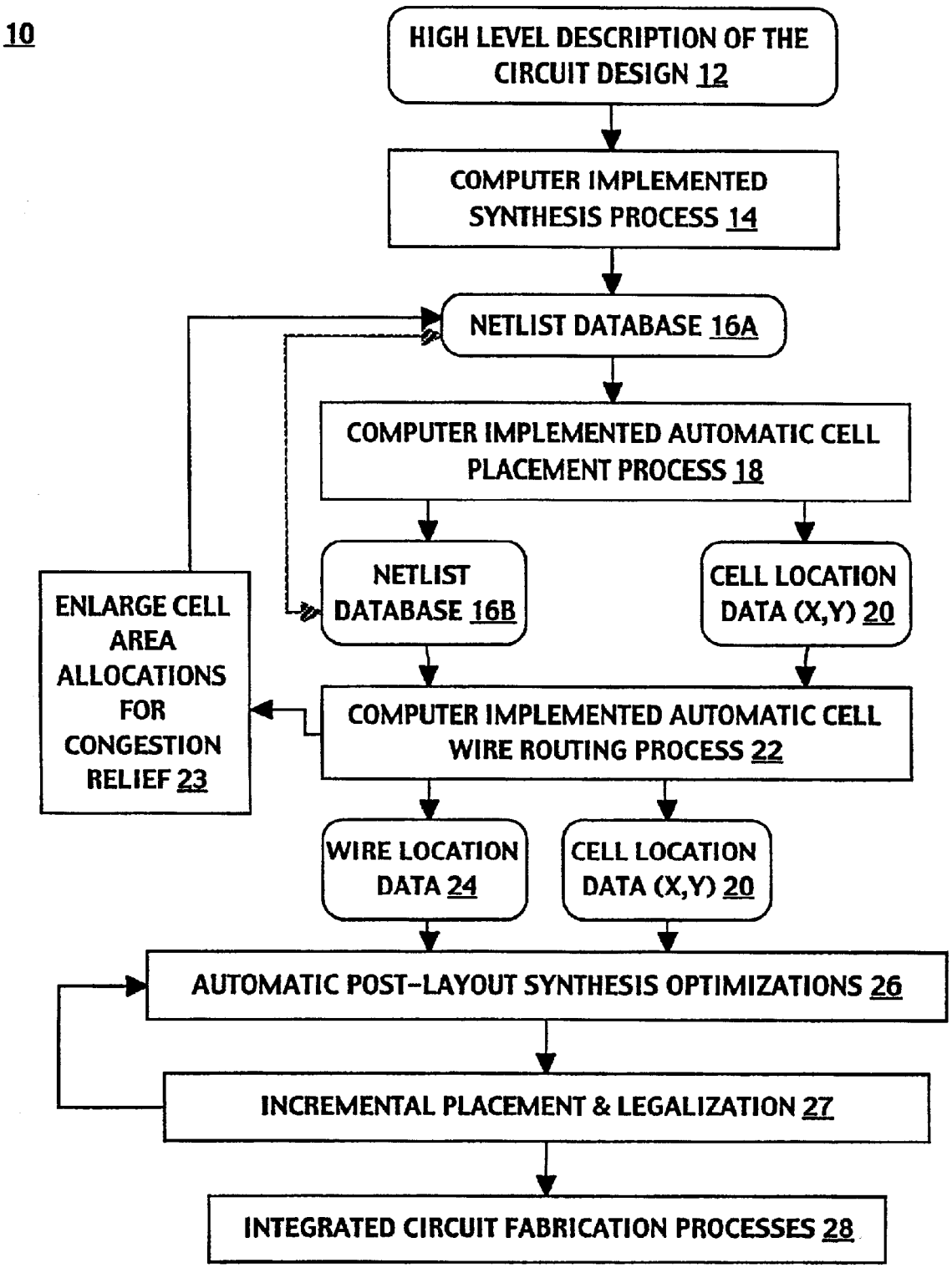
FIG. 1 is a data flow diagram of the prior art process for the physical design of an integrated circuit.

In the following detailed description of the present invention, a method for multiple pass optimization for automatic electronic circuit placement, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail as not to unnecessarily obscure aspects of the present invention.

Notation and Nomenclature

Some portions of the detailed descriptions which follow (e.g., processes in systems 10 and 200) are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "indexing" or "processing" or "computing" or "translating" or "calculating" or "determining" or "scrolling" or "displaying" or "recognizing" or "generating" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Multiple Pass Optimization for Automatic Electronic Circuit Placement

The present invention is described in the context of the field of electronic design automation (EDA). More particularly, embodiments of the present invention relate to techniques for cell placement and other optimizations used in the design and fabrication of integrated circuit devices. It is appreciated, however, that elements of the present invention may be utilized in the design and fabrication of other types of circuits, for example printed wiring boards.

Reference is hereby made to U.S. Pat. No. 6,282,693, "Non-linear Optimization System and Method for Wire Length and Density within an Automatic Electronic Circuit Placer," which is incorporated by reference in its entirety.

Reference is hereby made to U.S. patent application Ser. No. 09/216,632 filed on Dec. 16, 1998, "Non-linear Optimization System and Method for Wire Length and Delay Optimization for an Automatic Electronic Circuit Placer," which is incorporated by reference in its entirety. The method therein is hereinafter referred to as the technique of direct timing driven placement.

Reference is further made to U.S. patent application Ser. No. 60/159,687 filed on Oct. 14, 1999, "Detailed Placer for Optimizing High Density Cell Placement in a Linear Runtime," which is incorporated by reference in its entirety.

Figure 2:
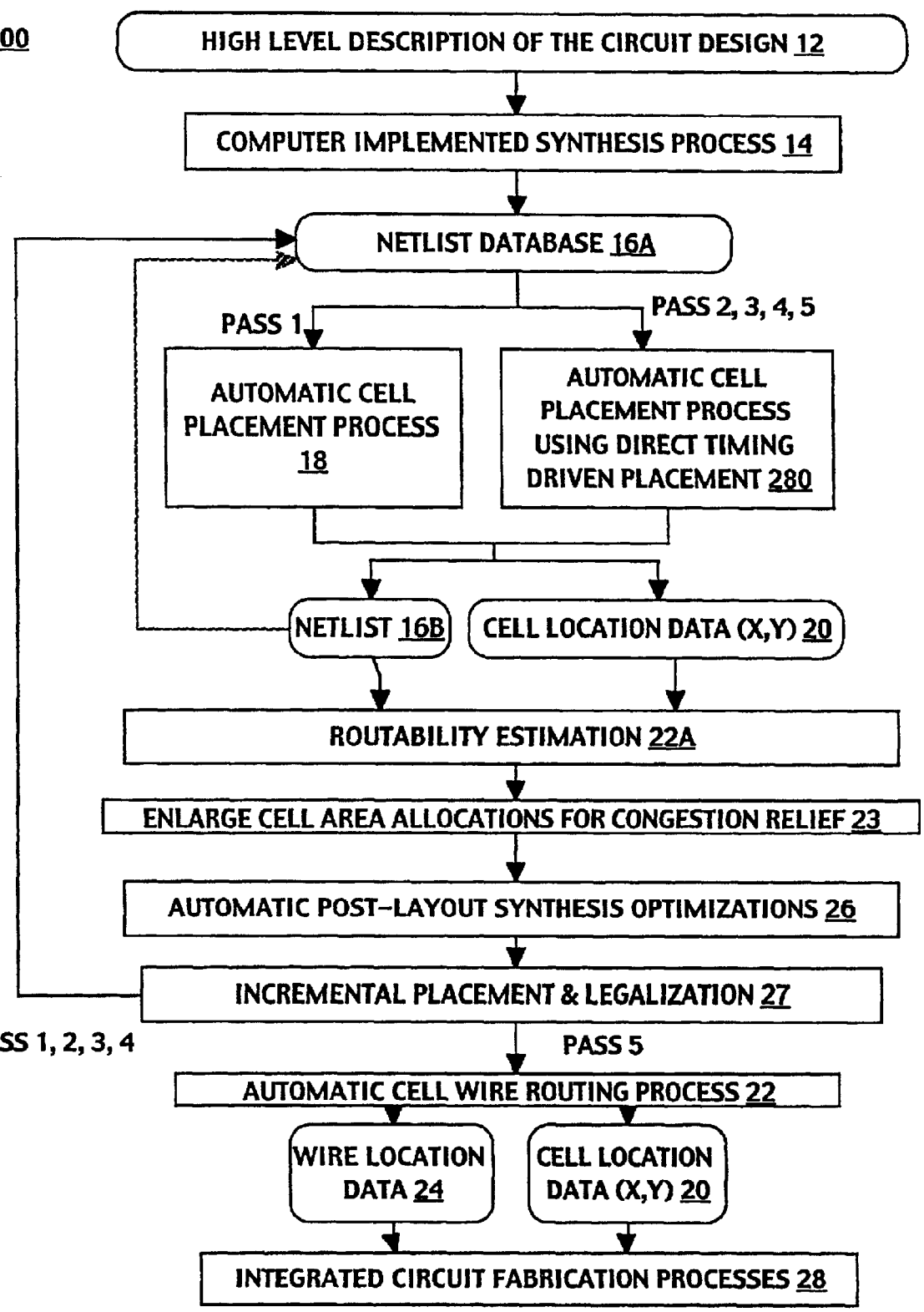
FIG. 2 is a data flow diagram of a novel process for the physical design of an integrated circuit, according to an embodiment of the present invention.

FIG. 2 shows an exemplary system 200 of computer programs and other processes used to automate the design of electronic circuits, according to an embodiment of the present invention. Note that all of the data structures may be compatible with the prior art system 10. In addition, many of the computer implemented processes, e.g., synthesis 14, placement 18, routing 22 and timing analysis 26 may be identical to the prior art.

Importantly, the process flow of system 200 and the particular combinations of well known tools are novel.

Within system 200, the designer first produces a high-level description 12 of the circuit in a hardware description language such as Verilog or VHDL. Then this high-level description 12 is converted into a netlist 16a using a computer implemented synthesis process 14 such as the "Design Compiler" by Synopsys of Mountain View, Calif.

Importantly, computer implemented automatic cell placement process 18 does not use the direct timing driven placement technique. Rather, another well known placement technique which does not attempt to optimize timing is employed. Examples include conjugate gradient placement using weighted nets (but without timing driven placement), quadratic partitioning and synthetic annealing.

As was discussed previously, direct timing driven placement would yield poor results on this initial placement.

The automatic placement computer program 18 finds a location for each cell on a circuit board or silicon chip. The output of the automatic cell placement process 18 includes a data structure 20 including the (x, y) position for each cell of the IC design. In some cases, the netlist 16a is modified and a new netlist 16b is generated. In other cases, the netlist 16b is the same as netlist 16a.

Next, the designer may supply the netlist 16a and the cell location data structure 20, generated by the placement program 18, to a computer implemented automatic wire routing process 22.

In an embodiment of the present invention, computer implemented automatic cell wire routing process 22 from FIG. 1 may be replaced with routability estimation process 22a, as shown in FIG. 2. Routability estimation process 22a does not actually perform the routing of wires; rather it produces a probabilistic estimation to predict the future success of actual routing process 22. Routability estimation process 22a may operate appreciably faster than routing process 22.

Routability estimation process 22a may predict that the design can not be routed. If this is the case, the designer may choose to enlarge cell area allocations for congestion relief 23.

Importantly, after any optional cell area enlargements are made, the process is not rejoined at placement 18 as in the prior art, but rather flows through optional automatic post-layout synthesis optimizations process 26 and incremental and legalization process 27. Modifications may be made to netlist database 16A, and process flow may branch as shown in FIG. 2.

This gives congestion expansion the opportunity to account for the congestion introduced by the post-layout synthesis optimizations process 26. This also allows the placer to optimize wire length after post-layout optimization and legalization process 27.

The reason that the post-layout synthesis optimizations process 26 may be successfully run after placement adjustments is that, unlike in the prior art, the subsequent placement for this and all other subsequent placement steps will be direct timing driven placement 280.

Direct timing driven placement 280 has been found to be a superior placement method if it is initialized. That is, given a reasonable starting point, direct timing driven placement can generally improve on the design it is given.

Unlike non-timing driven placement 18, direct timing driven placement 280 has as one of its goals to optimize timing. Consequently, in contrast to placement 18, placement 280 is not "fighting" the post-layout synthesis optimizations process 26 which is also trying to optimize timing.

If computer implemented automatic cell wire routing process 22 completes routing all wires, it may generate wire geometry within data structure 24. The wire geometry data structure 24 and cell placement data structure 20 together represent the details of the final circuit implementation.

Importantly, even the timing results are found to meet requirements, an embodiment of the present invention calls for the process to be repeated, with slight, but important, modifications.

Referring to FIG. 2, the cell location data (x, y) 20 has not been fully optimized. According to an embodiment of the present invention, process flow may pass through optional post layout timing analysis 26 and incremental placement and legalization process 27 to begin again with computer implemented automatic cell placement process using direct timing driven placement 280.

In an embodiment of the present invention, only one pass through non-timing driven placement 18 is ever performed. Subsequently, after a single pass through placement 18, all placement operations are performed by direct timing driven placement 280.

As discussed above, one benefit of direct timing driven placement is that it is able to cooperate with the post-layout synthesis optimizations process 26 in a multiple pass environment.

As such, improvements in the layout of an integrated circuit may be realized through system 200. Multiple passes may further optimize placement and improve timing, resulting in an integrated circuit that is of greater commercial value.

Further, the use of direct timing driven placement allows repeated synthesis to be incorporated into the resolution of congestion, which may further optimize placement and decrease design cycle time, both of which have significant commercial advantages.

Experimental investigation has shown that a total of five passes of synthesis, placement and routing, with the first placement process 18 performed by techniques other than direct timing driven placement, and subsequent placements performed by direct timing driven placement 280, is a good engineering compromise between increased design time and diminishing marginal returns of further optimizations.

It should be appreciated, however, that even a single pass of direct timing driven placement 280 following a first pass of non-timing driven placement 18 (and one pass of routing 22) produces superior results when compared to non-direct timing driven placement 18. It also produces superior results when compared to multiple passes of non-direct timing driven placement 18, or multiple passes of direct timing driven placement 280 without an initial pass of non-direct timing driven placement 18.

Finally, after five passes through the placement and synthesis processes, the wires of the design may be routed by automatic cell wire routing process 22, producing wire location data 24. Combined with cell location data (x, y) 20, this data may be used in integrated circuit fabrications processes 28.

Figure 3:
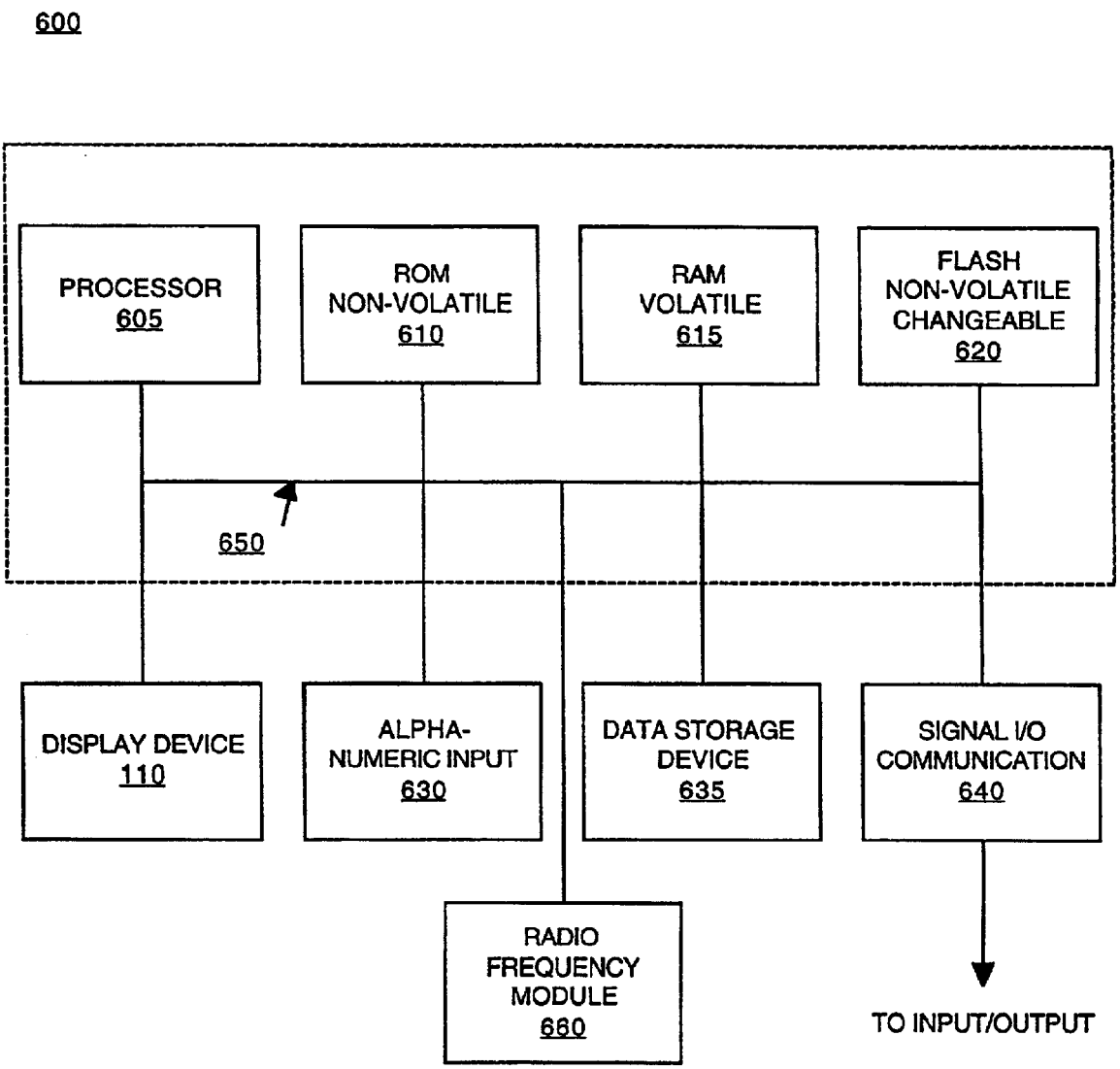
FIG. 3 is a block diagram of a computer system, which may be used as a platform to implement embodiments of the present invention.

FIG. 3 illustrates circuitry of computer system 600, which may form a platform for the implementation of embodiments of the present invention. Computer system 600 includes an address/data bus 650 for communicating information, a central processor 605 functionally coupled with the bus for processing information and instructions, a volatile memory 615 (e.g., random access memory RAM) coupled with the bus 650 for storing information and instructions for the central processor 605 and a non-volatile memory 610 (e.g., read only memory ROM) coupled with the bus 650 for storing static information and instructions for the processor 605. Computer system 600 also optionally includes a changeable, non-volatile memory 620 (e.g., flash) for storing information and instructions for the central processor 605, which can be updated after the manufacture of system 600.

Computer system 600 also optionally includes a data storage device 635 (e.g., a rotating magnetic disk) coupled with the bus 650 for storing information and instructions.

Also included in computer system 600 of FIG. 6 is an optional alphanumeric input device 630. Device 630 can communicate information and command selections to the central processor 600. Device 630 may take the form of a touch sensitive digitizer panel or typewriter-style keyboard. Display device 110 utilized with the computer system 600 may be a liquid crystal display (LCD) device, cathode ray tube (CRT), field emission device (FED, also called flat panel CRT), light emitting diode (LED), plasma display device, electro-luminescent display, electronic paper or other display device suitable for creating graphic images and alphanumeric characters recognizable to the user. Optional signal input/output communication device 640 is also coupled to bus 650.

System 600 optionally includes a radio frequency module 660, which may implement a variety of wireless protocols, for example IEEE 802.11 or Bluetooth.

The preferred embodiment of the present invention, a system and method for multiple pass optimization for automatic electronic circuit placement, is thus described. While the present invention has been described in particular embodiments, it should be appreciated that the present invention should not be construed as limited by such embodiments, but rather construed according to the below claims.

What is claimed is:

1. A method for placing circuit elements on an integrated circuit, the method comprising:

a) synthesizing a high level description of a circuit to produce a circuit design;

b) placing cells of said circuit design by use of one of b1) non-direct timing driven processes, and b2) direct timing driven processes;

c) routing wiring to connect said cells, thereby generating a layout;

d) modifying cell area allocations in said layout, if necessary to relieve congestion;

e) performing a post-layout synthesis optimization with said cells; and f) providing and incremental placement of said cells, wherein one of b1 and b2) is performed during a pass including c), d), e), and f), wherein b1) is performed during a first pass, and wherein b2) is performed during any subsequent pass.

2. The method of claim 1 wherein b1) comprises:

placing cells to minimize total weighted length of wiring interconnecting said cells.

3. The method of claim 1 wherein said c) comprises:

c1) estimating routability to connect said cells.

4. The method of claim 1 wherein at least 4 subsequent passes are performed.

5. The method claim 1 wherein e) comprises:

e1) adding at least one additional cell to minimize signal timing, and f) comprises:

f1) legalizing any additional cells added during e).

6. The method of claim 1 wherein e) comprises:

e1) minimizing required signal timing within said layout.

7. The method of claim 6 wherein e1) comprises at least one of:

changing a current-handling capacity of a circuit element and adding a buffer.

* * * * *